United States Patent
Crespi et al.

(10) Patent No.: US 10,333,506 B2
(45) Date of Patent: Jun. 25, 2019

(54) HIGH-SPEED CURRENT COMPARATOR SUITABLE FOR NANO-POWER CIRCUIT DESIGN

(71) Applicant: SYNAPTICS INCORPORATED, San Jose, CA (US)

(72) Inventors: Lorenzo Crespi, Costa Mesa, CA (US); Kyehyung Lee, Austin, TX (US); Davide Cartasegna, Oceanside, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/807,522

(22) Filed: Nov. 8, 2017

(65) Prior Publication Data

US 2018/0131359 A1    May 10, 2018

Related U.S. Application Data

(60) Provisional application No. 62/419,416, filed on Nov. 8, 2016.

(51) Int. Cl.
*H03K 5/24* (2006.01)
*H03K 5/02* (2006.01)

(52) U.S. Cl.
CPC ........... *H03K 5/2481* (2013.01); *H03K 5/023* (2013.01)

(58) Field of Classification Search
CPC .................................................. H03K 5/2481
See application file for complete search history.

(56) References Cited

U.S. PATENT DOCUMENTS

| 9,024,603 | B2 | 5/2015 | Friend et al. |
| 2009/0212825 | A1* | 8/2009 | Maone ................ H03K 5/2481 327/52 |
| 2010/0164627 | A1 | 7/2010 | Park et al. |
| 2011/0204923 | A1 | 8/2011 | Ochi |
| 2012/0206203 | A1 | 8/2012 | Cozzolino |
| 2013/0200872 | A1 | 8/2013 | Friend et al. |

FOREIGN PATENT DOCUMENTS

WO    WO 2016-001207 A1    1/2016

OTHER PUBLICATIONS

R. Del Rio-Fernandez et al., "A Mismatch-Insensitive High-Accuracy High-Speed Continuous-Time Current Comparator in Low Voltage Cmos", 1997, pp. 111-116, Instituto de Microelectronica de Sevilla.
J. Masciotti, "CMOS Current-Mode Analog Circuit Building Blocks for RF DC-DC Converter Controllers", 4 pages, New York.

* cited by examiner

*Primary Examiner* — Daniel C Puentes
(74) *Attorney, Agent, or Firm* — Haynes and Boone, LLP (57) ABSTRACT

Systems and methods according to one or more embodiments are provided for a current comparator with biasing circuitry to provide for low power consumption and high-speed performance. In one example, a system includes an input port to receive a current pulse and an amplifier configured to provide a voltage pulse at an output port in response to the current pulse. The system also includes a first biasing circuit coupled between the output port and the input port to selectively limit a voltage at the input port. The system further includes a second biasing circuit coupled to the amplifier to selectively adjust a bias of the amplifier.

18 Claims, 5 Drawing Sheets

HIGH-SPEED CURRENT COMPARATOR SUITABLE FOR NANO-POWER CIRCUIT DESIGN

CROSS-REFERENCE TO RELATED APPLICATIONS

This application claims the benefit of and priority to U.S. Provisional Patent Application No. 62/419,416 filed Nov. 8, 2016 and entitled "HIGH-SPEED CURRENT COMPARATOR SUITABLE FOR NANO-POWER CIRCUIT DESIGN," which is incorporated herein by reference in its entirety.

TECHNICAL FIELD

The present invention relates generally to analog signal processing and, more particularly, to a high-speed current comparator circuit suitable for nano-power circuits.

BACKGROUND

In the field of analog signal processing, it is becoming increasingly critical to reduce power consumption and increase speed in advanced analog integrated circuits used in battery operated systems such as mobile devices, for example. To meet this need, DC to DC converters and data converters are being designed with nanoampere or microampere range power consumptions. However, current comparators used in DC to DC converters and data converters, for example, may require a tradeoff with current comparator speed to reduce power consumption.

Current comparator speed may be defined as the inverse of the delay between the time at which the input current changes polarity and the time at which the comparator output toggles. To reduce the delay, and subsequently increase comparator speed, internal parasitic capacitors must be charged at a faster rate. Therefore, conventional current comparators designed for a reduction in power consumption may lack the necessary speed required to support advanced DC to DC converters and data converter applications. Thus, there is a need in the art for improved current comparator solutions that reduce power consumption while achieving a speed suitable for applications in DC to DC converters.

SUMMARY

In accordance with various embodiments further discussed herein, method and systems for implementing a high-speed current comparator suitable for non-power circuits are provided.

In one or more embodiments, a system includes an input port, an amplifier, a first biasing circuit and a second biasing circuit. The input port is arranged to receive a current pulse. The amplifier (e.g., a class AB amplifier with a CMOS output stage) is operable to provide a voltage pulse at an output port in response to the received current pulse. The first biasing circuit is coupled between the output port and the input port and is operable to selectively limit a voltage at the input port. In one embodiment, the first biasing circuit includes a non-linear feedback circuit coupled between the output port and the input port to provide the selectively limited voltage at the input port. The second biasing circuit is coupled to the amplifier and configured to selectively adjust the bias of the amplifier. In various embodiments, the second biasing circuit includes one or more of a class AB amplifier biasing circuit, a positive bias voltage circuit providing a selectively adjustable positive bias voltage to the amplifier, and a negative bias voltage circuit providing a selectively adjustable negative bias voltage to the amplifier.

In one or more embodiments, the system may also include a bias current circuit providing a selectively adjustable bias current to the amplifier to control a quiescent current of the amplifier. The system may also include a selectively adjustable positive power source coupled to the first biasing circuit and a selectively adjustable negative power source coupled to the first biasing circuit.

A method in accordance with one or more embodiments, includes receiving, at an input port, a current pulse and providing, by an amplifier, a voltage pulse at an output port in response to the current pulse. The method further includes selectively limiting, by a first biasing circuit coupled between the output port and the input port, a voltage at the input port, and selectively adjusting, by a second biasing circuit coupled to the amplifier, a bias of the amplifier. In various embodiments of the method, the amplifier is configured as a class AB amplifier comprising a CMOS output stage, and the second biasing circuit is configured as a class AB amplifier biasing circuit. In one embodiment, the first biasing circuit includes a non-linear feedback circuit coupled between the output port and the input port to provide the selectively limited voltage at the input port. The second biasing circuit may include a positive bias voltage circuit and a negative bias voltage circuit.

The method may further include selectively adjusting, by the positive bias voltage circuit, a positive bias voltage provided to the amplifier, and selectively adjusting, by the negative bias voltage circuit, a negative bias voltage provided to the amplifier. In one or more embodiments the method may include selectively adjusting, by a bias current circuit, a bias current provided to the amplifier to control a quiescent current of the amplifier. The method may also include selectively adjusting a positive power source coupled to the first biasing circuit, and selectively adjusting a negative power source coupled to the first biasing circuit.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

The included drawings are for illustrative purposes and serve only to provide examples of possible systems and methods for the disclosed methods and system for providing a high-speed low power current comparator circuit. These drawings in no way limit any changes in form and detail that may be made to that which is disclosed by one skilled in the art without departing from the spirit and scope of this disclosure.

DETAILED DESCRIPTION

The present disclosure describes systems and methods that address a need in the art of signal processing for providing a current comparator with low power consumption and high-speed performance. The current comparator in the present disclosure describes a current comparator that operates with a bias current in the nanoampere range while achieving a speed suitable for applications in DC to DC converters.

In one embodiment, a high-speed low power current comparator is designed with a non-linear feedback circuit coupled between input and output ports to fix a voltage at the input port less than the supply voltage. The non-linear feedback circuit fixes the voltage at the input port for both a positive voltage and a negative voltage to avoid rail to rail voltage excursions. In this regard, a faster comparator output response time results in fixing the input voltage less than the supply voltage. As used herein, the term "couple" and its cognate terms such as "couples" and "coupled" can include a direct connection, a connection through intervening devices or elements, a hard-wired connection, an integrated circuit connection, a bus or other suitable connections.

In various embodiments, an output stage of a current comparator class AB amplifier is biased with a biasing circuit. The biasing circuit includes positive and negative bias circuits to selectively adjust a bias voltage and a bias current of the current comparator amplifier. Bias voltage and bias current may be set to reduce power consumption within the current comparator. Furthermore, comparator output response time may be decreased by adjusting a channel length and channel width of the current comparator amplifier output transistors to minimize transistor internal parasitic capacitance. In this regard, a faster output response time may be realized by minimizing channel length and channel width to reduce the time to charge internal parasitic capacitance. Significantly, bias voltages, bias currents, and quiescent currents of the current comparator may be controlled independent of transistor channel length and channel width to optimize both power consumption and speed of the current comparator. In this regard, the present current comparator may operate with a bias current in the nanoampere range and achieve a faster output response time suitable for DC to DC converter applications.

Embodiments of the present disclosure may be contrasted to pre-existing solutions for reducing current comparator power consumption and providing a faster output response time. Such solutions typically achieve a faster output response time, but with an increase in power consumption. For example, conventional current comparators may utilize the non-linear feedback circuit coupled between input and output ports to provide a faster output response time by fixing the voltage at the current comparator input to approximately one half the supply voltage. However, utilizing this technique in conventional current comparators causes a quiescent current to flow through the output amplifier stage. The quiescent current depends on the on-resistance of the output stage transistors. Additionally, the quiescent current may change with variations in transistor process, temperature, and supply voltages resulting in a current of approximately ten to hundreds of microamperes. In this regard, the quiescent current may provide a faster output response time by reducing the time to charge internal parasitic capacitance. However, there may be a resultant increase in power consumption due to the high quiescent current.

Conventional solutions for reducing quiescent current and reducing power consumption rely on adjusting a channel length and channel width of current comparator output transistors. In this regard, in order to reduce quiescent current, the ratio between channel width and channel length (e.g., W/L) of the amplifier stage transistors must be decreased. After the channel width is reduced to the minimum allowed by the transistor technology, the ratio can only be decreased by increasing the channel length. However, increasing the channel length causes a subsequent increase in transistor internal parasitic capacitance resulting in a longer comparator delay. Thus, conventional solutions may provide for either a faster current comparator output response time or a reduction in power consumption. Therefore, conventional solutions do not provide for both a reduction in power consumption and a faster output response time as in the present disclosure.

Figure 1:
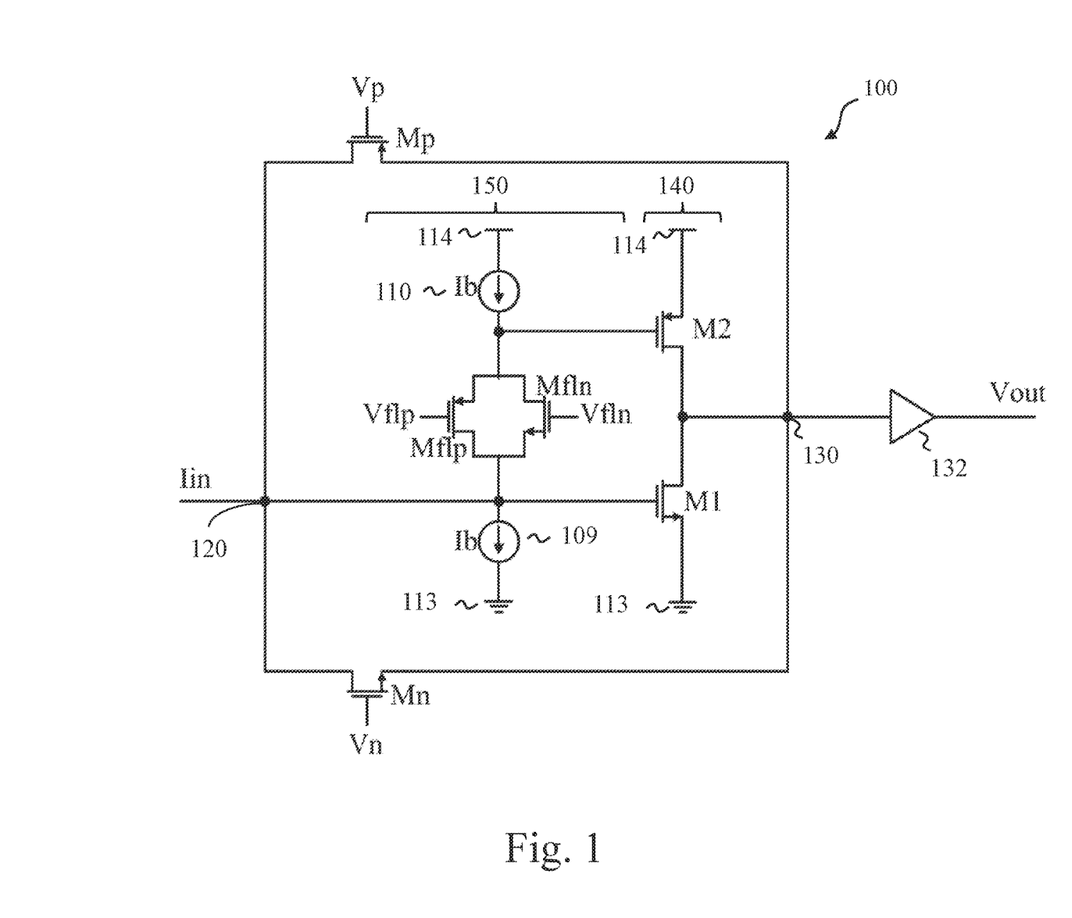
FIG. 1 illustrates a schematic diagram of a high-speed low power current comparator in accordance with an embodiment of the disclosure.

FIG. 1 illustrates a schematic diagram of a high-speed low power current comparator system 100 in accordance with an embodiment of the disclosure. System 100 may be used in audio analog signal processing applications to convert a current pulse to a voltage pulse in accordance with various techniques described herein. System 100 may be used on a variety of platforms, such as computers, smartphones, tablets, and other devices requiring audio analog signal processing techniques. In some embodiments, system 100 may be used in applications requiring both high speed and low DC power consumption.

In some embodiments, system 100 converts a positive input current pulse to a corresponding positive output voltage pulse of approximately the same duration. Additionally, system 100 converts a negative input current pulse to a corresponding negative output voltage pulse of approximately the same duration. System 100 may be used in a variety of circuits such as DC to DC converters and/or data converters operating in a nanoampere or microampere range. Current comparator may be implemented in silicon or other suitable materials, and may be constructed from discrete devices, formed as integrated circuits, or can be constructed in other suitable manners.

In one embodiment, system 100 includes a PMOS transistor Mp and an NMOS transistor Mn which form a feedback clamp (e.g., a first biasing circuit) to selectively limit a voltage at an input port 120. The drain of PMOS transistor Mp is coupled to the drain of NMOS transistor Mn to provide a negative feedback and prevents the input voltage from swinging to either rail such as positive bias voltage Vp and/or negative bias voltage Vn. For example, as a positive current Iin is flowing into input port 120, NMOS transistor Mn is driven into an ON state and a negative feedback is created, fixing a positive voltage at input port 120. Similarly, when a negative current Iin is flowing from input port 120, PMOS transistor Mp is driven into an ON state and a feedback is created, fixing a negative voltage at input port 120. The voltage at input port 120 is limited to approximately the average voltage of a positive power source 114 and a negative power source 113 (e.g., such as DC ground). Limiting a positive and negative input voltage range avoids rail-to-rail commutation and provides for faster response times of system 100. Furthermore, the input voltage range may be limited due to a high gain of amplifier 140, discussed herein.

In some embodiments, positive bias voltage 103 may be a positive five volts direct current (DC) voltage power source. In some embodiments, negative bias voltage Vn may be a negative five volts DC voltage power source. However, in various embodiments, positive bias voltage Vp is less than positive power source 114 voltage by at least a PMOS threshold voltage (e.g., such as PMOS Mp), and negative bias voltage Vn is greater than negative power source 113 voltage by at least an NMOS threshold voltage (e.g., such as NMOS). In various embodiments, the voltage Vp may be greater than or less than the voltage Vn. Other positive and negative DC voltage power sources may be provided in other embodiments.

The gate of PMOS transistor Mp is coupled to positive bias voltage Vp. The source of PMOS transistor Mp is coupled to output port 130. Positive bias voltage Vp may be adjusted to limit a positive output voltage at output port 130. In this regard, transistor Mp limits positive output voltage at output port 130 to a voltage less than the sum of positive bias voltage 103 plus Vthp. The gate of NMOS transistor Mn is coupled to negative bias voltage Vn. The source of NMOS transistor Mp is coupled to output port 130. Negative bias voltage Vn may be adjusted to limit a negative output voltage at output port 130. In this regard, transistor Mn limits negative output voltage at output port 130 to a voltage greater than the sum of negative bias voltage Vn plus Vthn. Line buffer 132 may be coupled to the output port 130 to provide buffering of output voltage signal Vout 102.

In some embodiments, system 100 includes an NMOS transistor M1 and a PMOS transistor M2 formed as amplifier 140. In some embodiments, amplifier 140 is formed as a class AB amplifier. NMOS transistor M1 and PMOS transistor M2 may be arranged as a CMOS output stage. The source of NMOS transistor M1 may be coupled to the negative power source 113 (e.g., DC ground). The gate of transistor M1 may be coupled to a bias current circuit 109. The source of PMOS transistor M2 may be coupled to positive power source 114. The gate of transistor M2 may be coupled to a bias current circuit 110. Drains of NMOS transistor M1 and PMOS transistor M2 may be coupled to output port 130 to provide a positive magnitude output voltage Vout 102 and/or a negative magnitude output voltage Vout 102 in response to input current Iin. In some embodiments, positive power source 114 may be a positive five volts DC voltage power source. However, other positive and/or negative DC voltage power sources may be provided in other embodiments.

PMOS transistor Mflp, NMOS transistor Mfln, bias current circuit 109, and bias current circuit 110 form a biasing circuit 150 (e.g., a second biasing circuit) for biasing amplifier 140. Biasing circuit 150 may be used to selectively adjust a bias of amplifier 140 and limit amplifier 140 quiescent current. Quiescent current is the current drawn by amplifier 140 when it is not amplifying an input signal. Quiescent current adds to system 100 power consumptions and by selectively limiting quiescent current in amplifier 140, power consumption may be reduced in system 100.

In some embodiments, biasing circuit 150 is implemented as a class AB amplifier biasing circuit. Biasing circuit 150 may include a positive bias voltage circuit formed by PMOS transistor Mflp and a negative bias voltage circuit formed by NMOS transistor Mfln. The gate of PMOS transistor Mflp is coupled to adjustable positive bias voltage source Vflp to selectively adjust a positive bias voltage of amplifier 140. The gate of NMOS transistor Mfln is coupled to adjustable negative bias voltage source Vfln to selectively adjust a negative bias voltage of amplifier 140.

In some embodiments, biasing circuit 150 includes bias current circuits 109/110 to selectively limit a bias current of amplifier 140. In some embodiments, bias current circuit 109 is coupled to gate of NMOS transistor M1 at a first end and the negative power source 113 at a second end. Bias current circuit 109 selectively limits bias current to NMOS transistor M1. In some embodiments, bias current circuit 110 is coupled to positive power source 114 at a first end and gate of PMOS transistor M2 at a second end. Bias current circuit 110 selectively limits bias current to PMOS transistor M2. In some embodiments, bias currents 109/110 may be selectively adjusted to provide a bias current in an approximate range of nanoamperes to reduce power consumption of system 100. However, other bias currents 109/110 ampere ranges are possible in other embodiments.

Various biasing techniques suitable for the present embodiment are described in "Advanced Low Voltage and High-Speed Techniques for BiCMOS, CMOS and Bipolar Operational Amplifier", K. De Langen, Delft University Press, November 1999, which is hereby incorporated by reference. Other class AB biasing techniques may also be used for biasing amplifier 140.

In general, bias voltages Vflp, Vfln, the bias current generated by bias current circuit 109, and the bias current generated by bias current circuit 110 may be selectively adjusted to reduce a quiescent current of transistor M1, and transistor M2 of amplifier 140 to minimize power consumption. Furthermore, comparator delay (e.g., delay between the time at which the input current changes polarity and the time at which the comparator output toggles) may be reduced in system 100 by adjusting a channel length and channel width of each of amplifier 140 transistors M1, and M2 to minimize transistor internal parasitic capacitance. In this regard, a decrease in output response time of system 100 may be realized by a reduction in time to charge internal parasitic capacitance.

Bias voltages, bias currents, and quiescent currents of system 100 may be controlled independent of transistor channel length and channel width to provide for both a reduction in power consumption and a faster output response time. Significantly, system 100 may operate with a bias current in the nanoampere range while achieving a speed suitable for application in a DC to DC converter, for example.

Figure 2:
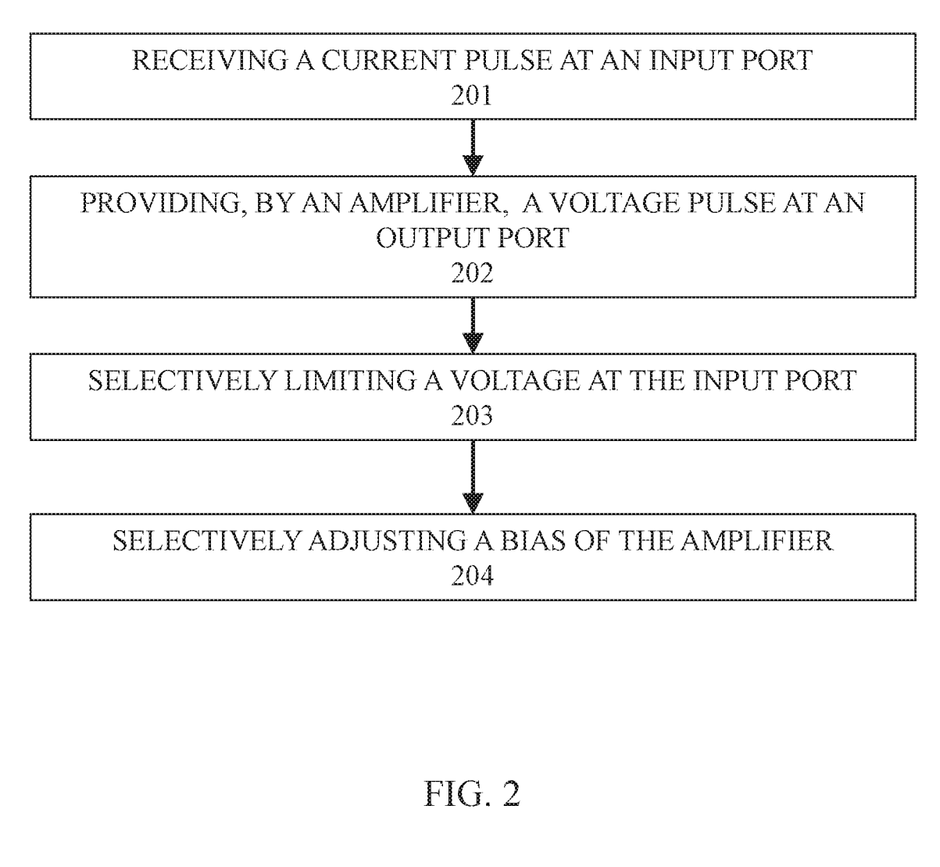
FIG. 2 illustrates a process of using a high-speed low power current comparator in accordance with an embodiment of the disclosure.

FIG. 2 illustrates a process of using the high-speed low power current comparator system 100 in accordance with an embodiment of the disclosure.

In block 201, system 100 may receive a current pulse Iin of a specified duration at input port 120. In some embodiments, current pulse Iin may be a positive magnitude current pulse and/or a negative current magnitude pulse.

In block 202, amplifier 140 may convert current pulse Iin to a corresponding voltage pulse Vout 102. In some embodiments, voltage pulse Vout 102 may be a positive magnitude voltage pulse and/or a negative magnitude voltage pulse in accordance with the corresponding current pulse Iin. Voltage pulse Vout 102 may be delayed relative to current pulse Iin, such as a delay between the time at which the input current changes polarity and the time at which the comparator output toggles, as discussed herein. Biasing circuit 150 may reduce the delay in system 100, as discussed herein.

In block 203, PMOS transistor Mp 101 and NMOS transistor Mn 102, which form a feedback clamp (e.g., a first biasing circuit), selectively limit the positive and negative voltage magnitude at input port 120. Furthermore, positive bias voltage Vp 103 may be adjusted to limit a positive output voltage at output port 130 and negative bias voltage Vn may be adjusted to limit a negative output voltage at output port 130.

In block 204, biasing circuit 150 may selectively adjust a bias of amplifier 140. In this regard, biasing circuit 150 may selectively adjust bias voltages, bias currents, and quiescent currents of NMOS transistor M1 111 and/or PMOS transistor M2 112.

Figure 3:
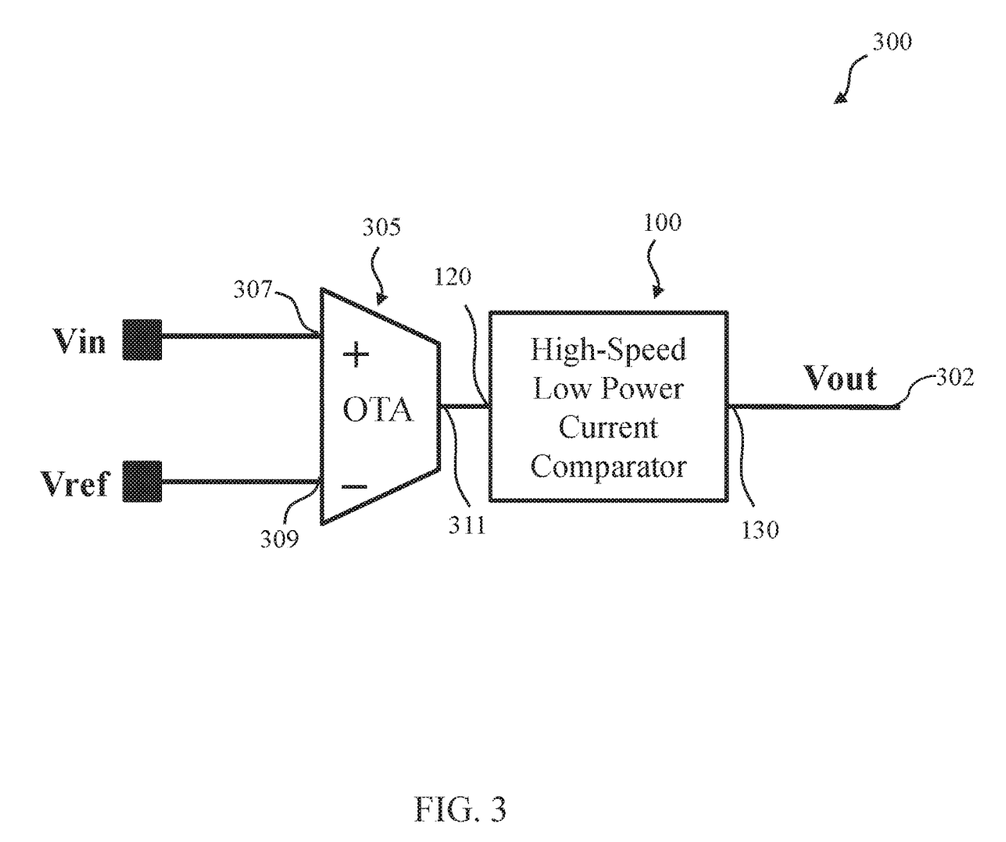
FIG. 3 illustrates a high-speed low power current comparator implemented in a voltage-mode comparator in accordance with an embodiment of the disclosure.

FIG. 3 illustrates a high-speed low power current comparator system 100 implemented in a voltage-mode comparator 300 in accordance with an embodiment of the disclosure. For example, operational trans-impedance amplifier (OTA) 305 may receive two voltage signals, a voltage signal Vin and a voltage signal Vref at corresponding OTA input ports 307 and 309, respectively. OTA 305 may process signals Vin and Vref and generate an output current signal proportional to the difference between signals Vin and Vref at an OTA output port 311. The output current signal is received at input port 120, processed by system 100, and a corresponding output voltage Vout 302 is provided at output port 130. In this regard, the high-speed low power current comparator system 100 is capable of combining with other analog signal processing elements to provide a robust comparator circuit.

Figure 4:
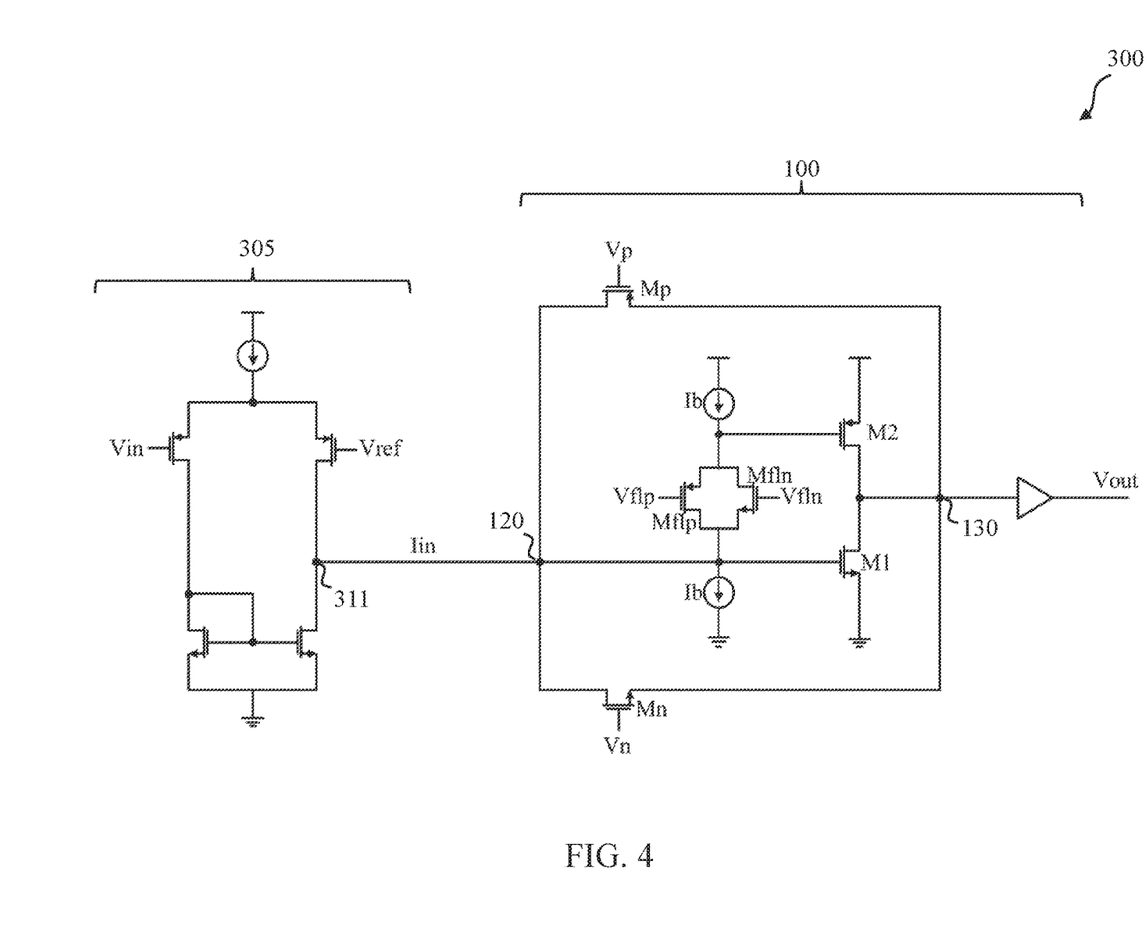
FIG. 4 illustrates a schematic diagram of a voltage-mode comparator in accordance with an embodiment of the disclosure.

FIG. 4 illustrates a schematic diagram of a voltage-mode comparator 300 in accordance with an embodiment of the disclosure. As shown in FIG. 4, voltage-mode comparator 300 functions as a voltage-mode continuous-time comparator without hysteresis. As illustrated in FIG. 4, transistor Mp 101 and transistor Mn 102 form a feedback clamp to selectively limit positive bias voltage Vp 103 and/or negative bias voltage Vn at input port 120. In this regard, the parasitic capacitance associated with transistors of OTA 305 (e.g., gate, drain, and source parasitic capacitance) coupled to OTA output port 311 are biased near the selectively limited voltages, as discussed herein. Advantageously, the time required to charge parasitic capacitances of OTA 305 are reduced in response to a polarity change of the difference voltage Vin minus Vref, resulting in a lower time delay of electrical signal propagation from input port 120 to output port 130 in system 100.

Figure 5:
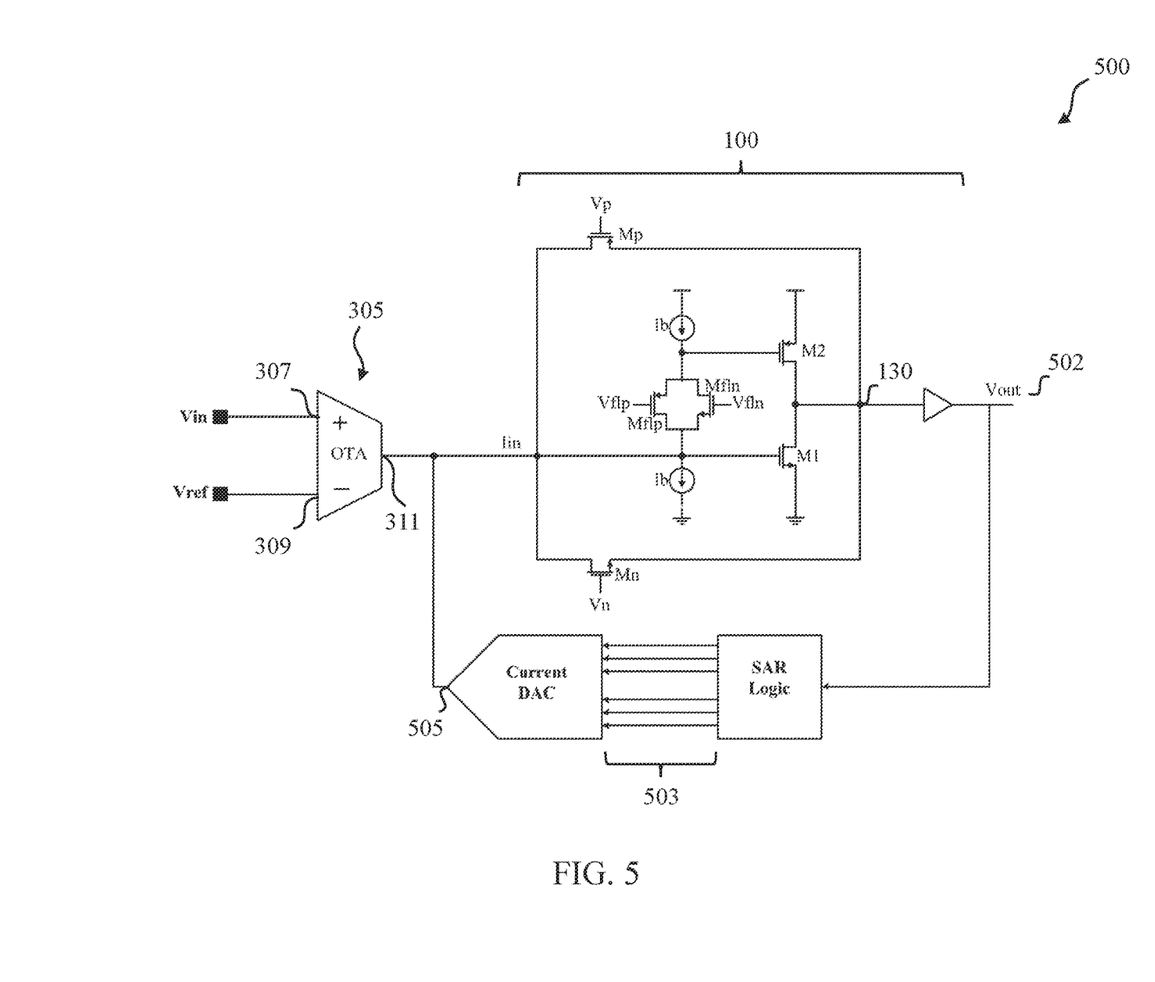
FIG. 5 illustrates a high-speed low power current comparator implemented in a low power successive approximation analog to digital converter in accordance with an embodiment of the disclosure.

FIG. 5 illustrates a high-speed low power current comparator implemented in a low power successive approximation analog to digital converter 500 in accordance with an embodiment of the disclosure. In some embodiments, the low power successive approximation analog to digital converter (e.g., low power SAR ADC) may be used in an audio circuit where low power and high speed are required. In this regard, an input voltage Vin and a reference voltage Vref are received at OTA input ports 307 and 309, respectively. OTA 305 and high-speed low power current comparator system 100 perform voltage to current operations and comparator operations, respectively, to provide an output signal Vout at output port 130. A SAR logic circuit, based on the value of Vout, adjusts the DAC code 503 until an output current 505 of a Current DAC is arbitrarily close to the current tin provided at OTA output port 311. Thus, the successive approximation analog to digital converter 500 converts an analog waveform (e.g., Vin) into a discrete digital signal representative of Vin for use in various embodiments of the audio analog signal processing circuits, as discussed herein.

Where applicable, various embodiments provided by the present disclosure may be implemented using hardware, software, or combinations of hardware and software. Also, where applicable, the various hardware components and/or software components set forth herein may be combined into composite components comprising software, hardware, and/ or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A system comprising:
    an input port arranged to receive a current pulse;
    an amplifier configured to provide a voltage pulse at an output port in response to the current pulse;
    a first biasing circuit comprising a non-linear feedback circuit coupled between the output port and the input port and configured to selectively limit a voltage at the input port; and
    a second biasing circuit coupled to the amplifier and configured to selectively adjust a bias of the amplifier.

2. The system of claim 1, wherein the amplifier is configured as a class AB amplifier comprising a CMOS output stage.

3. The system of claim 1, wherein the second biasing circuit is configured as a class AB amplifier biasing circuit.

4. The system of claim 3, wherein the second biasing circuit comprises a positive bias voltage circuit and a negative bias voltage circuit.

5. The system of claim 4, wherein the positive bias voltage circuit provides a selectively adjustable positive bias voltage to the amplifier.

6. The system of claim 4, wherein the negative bias voltage circuit provides a selectively adjustable negative bias voltage to the amplifier.

7. The system of claim 4, further comprising a bias current circuit, wherein the bias current circuit provides a selectively adjustable bias current to the amplifier to control a quiescent current of the amplifier.

8. The system of claim 1, further comprising a selectively adjustable positive power source coupled to the first biasing circuit.

9. The system of claim 1, further comprising a selectively adjustable negative power source coupled to the first biasing circuit.

10. A method comprising:
    receiving, at an input port, a current pulse;
    providing, by an amplifier, a voltage pulse at an output port in response to the current pulse;
    selectively limiting, by a first biasing circuit comprising a non-linear feedback circuit coupled between the output port and the input port, a voltage at the input port; and selectively adjusting, by a second biasing circuit coupled to the amplifier, a bias of the amplifier.

11. The method of claim 10, wherein the amplifier is configured as a class AB amplifier comprising a CMOS output stage.

12. The method of claim 10, wherein the second biasing circuit is configured as a class AB amplifier biasing circuit.

13. The method of claim 12, wherein the second biasing circuit comprises a positive bias voltage circuit and a negative bias voltage circuit.

14. The method of claim 13, further comprising selectively adjusting, by the positive bias voltage circuit, a positive bias voltage provided to the amplifier.

15. The method of claim 13, further comprising selectively adjusting, by the negative bias voltage circuit, a negative bias voltage provided to the amplifier.

16. The method of claim 13, further comprising selectively adjusting, by a bias current circuit, a bias current provided to the amplifier to control a quiescent current of the amplifier.

17. The method of claim 10, further comprising selectively adjusting a positive power source coupled to the first biasing circuit.

18. The method of claim 10, further comprising selectively adjusting a negative power source coupled to the first biasing circuit.

* * * * *

UNITED STATES PATENT AND TRADEMARK OFFICE
CERTIFICATE OF CORRECTION

PATENT NO. : 10,333,506 B2  
APPLICATION NO. : 15/807522  
DATED : June 25, 2019  
INVENTOR(S) : Lorenzo Crespi et al.

Page 1 of 1

It is certified that error appears in the above-identified patent and that said Letters Patent is hereby corrected as shown below:

In the Specification

In the Detailed Description,  
In Column 4, Line 54, change "tin" to --Iin--.  
In Column 7, Line 56, change "tin" to --Iin--.

Signed and Sealed this  
Twenty-ninth Day of October, 2019

Andrei Iancu  
*Director of the United States Patent and Trademark Office*